(12) United States Patent
Hourani et al.

(10) Patent No.: US 12,080,639 B2
(45) Date of Patent: Sep. 3, 2024

(54) CONTACT OVER ACTIVE GATE STRUCTURES WITH METAL OXIDE LAYERS TO INHIBIT SHORTING

(71) Applicant: Intel Corporation, Santa Clara, CA (US)

(72) Inventors: Rami Hourani, Beaverton, OR (US); Manish Chandhok, Beaverton, OR (US); Richard E. Schenker, Portland, OR (US); Florian Gstrein, Portland, OR (US); Leonard P. Guler, Hillsboro, OR (US); Charles H. Wallace, Portland, OR (US); Paul A. Nyhus, Portland, OR (US); Curtis Ward, Forest Grove, OR (US); Mohit K. Haran, Hillsboro, OR (US); Reken Patel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1105 days.

(21) Appl. No.: 16/579,077

(22) Filed: Sep. 23, 2019

(65) Prior Publication Data
US 2021/0090990 A1 Mar. 25, 2021

(51) Int. Cl.
*H01L 29/417* (2006.01)
*H01L 21/02* (2006.01)
(Continued)

(52) U.S. Cl.
CPC .... *H01L 23/5226* (2013.01); *H01L 21/02175* (2013.01); *H01L 21/76816* (2013.01);
(Continued)

(58) Field of Classification Search
CPC ................................................. H01L 29/41775
See application file for complete search history.

(56) References Cited

U.S. PATENT DOCUMENTS 9,837,402 B1 12/2017 Xie et al.
9,941,278 B2 4/2018 Labonte
(Continued)

FOREIGN PATENT DOCUMENTS

TW 201812911 4/2018
WO WO 2016/209296 12/2016

OTHER PUBLICATIONS

Search Report from European Patent Application No. 20181046.2, mailed Nov. 2, 2020, 8 pages.
(Continued)

*Primary Examiner* — Christopher A Johnson
(74) *Attorney, Agent, or Firm* — Schwabe, Williamson & Wyatt P.C.

(57) ABSTRACT

Contact over active gate structure with metal oxide layers are described are described. In an example, an integrated circuit structure includes a plurality of gate structures above substrate, each of the gate structures including a gate insulating layer thereon. A plurality of conductive trench contact structures is alternating with the plurality of gate structures. A portion of one of the plurality of trench contact structures has a metal oxide layer thereon. An interlayer dielectric material is over the plurality of gate structures and over the plurality of conductive trench contact structures. An opening is in the interlayer dielectric material and in a gate insulating layer of a corresponding one of the plurality of gate structures. A conductive via is in the opening, the conductive via in direct contact with the corresponding one of the plurality of gate structures, and the conductive via on the metal oxide layer.

17 Claims, 15 Drawing Sheets

(51) Int. Cl.
   *H01L 21/768*      (2006.01)
   *H01L 23/522*      (2006.01)
   *H01L 23/66*       (2006.01)
(52) U.S. Cl.
   CPC ........ *H01L 21/76897* (2013.01); *H01L 23/66* (2013.01); *H01L 2223/6677* (2013.01)

(56) References Cited

U.S. PATENT DOCUMENTS

| | | |
|---|---|---|
| 2013/0175583 A1 | 7/2013 | Yuan |
| 2014/0077305 A1* | 3/2014 | Pethe ................ H01L 21/76807 257/E21.409 |
| 2017/0372956 A1 | 12/2017 | Cheng |
| 2019/0371654 A1* | 12/2019 | Cheng ............... H01L 21/76897 |
| 2020/0075409 A1 | 3/2020 | Wang |
| 2020/0075422 A1 | 3/2020 | Wang |
| 2020/0135885 A1* | 4/2020 | Xie ................... H01L 21/76816 |

OTHER PUBLICATIONS

Office Action for Taiwan Patent Application No. 109121111 mailed Jan. 23, 2024, 15 pgs.

* cited by examiner

US 12,080,639 B2

CONTACT OVER ACTIVE GATE STRUCTURES WITH METAL OXIDE LAYERS TO INHIBIT SHORTING

TECHNICAL FIELD

Embodiments of the disclosure are in the field of advanced integrated circuit structure fabrication and, in particular, contact over active gate structure with metal oxide layers to inhibit shorting and methods of fabricating contact over active gate structure with metal oxide layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 2A:
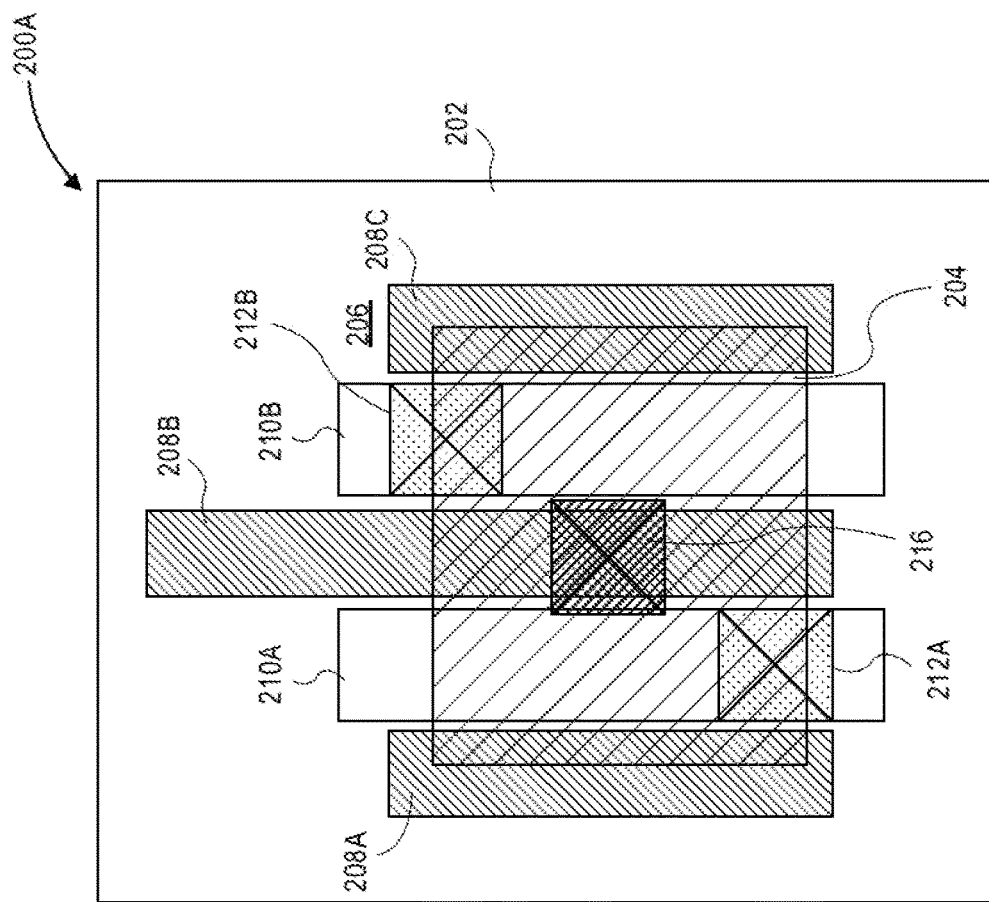
FIG. 2A illustrates a plan view of a semiconductor device having a gate contact via disposed over an active portion of a gate electrode, in accordance with an embodiment of the present disclosure.

Contact over active gate structure with metal oxide layers to inhibit shorting and methods of fabricating contact over active gate structure with metal oxide layers are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

To provide context, in technologies where space and layout constraints are somewhat relaxed compared with current generation space and layout constraints, a contact to gate structure may be fabricated by making contact to a portion of the gate electrode disposed over an isolation region. As an example, FIG. 1A illustrates a plan view of a semiconductor device having a gate contact disposed over an inactive portion of a gate electrode.

Figure 1A:
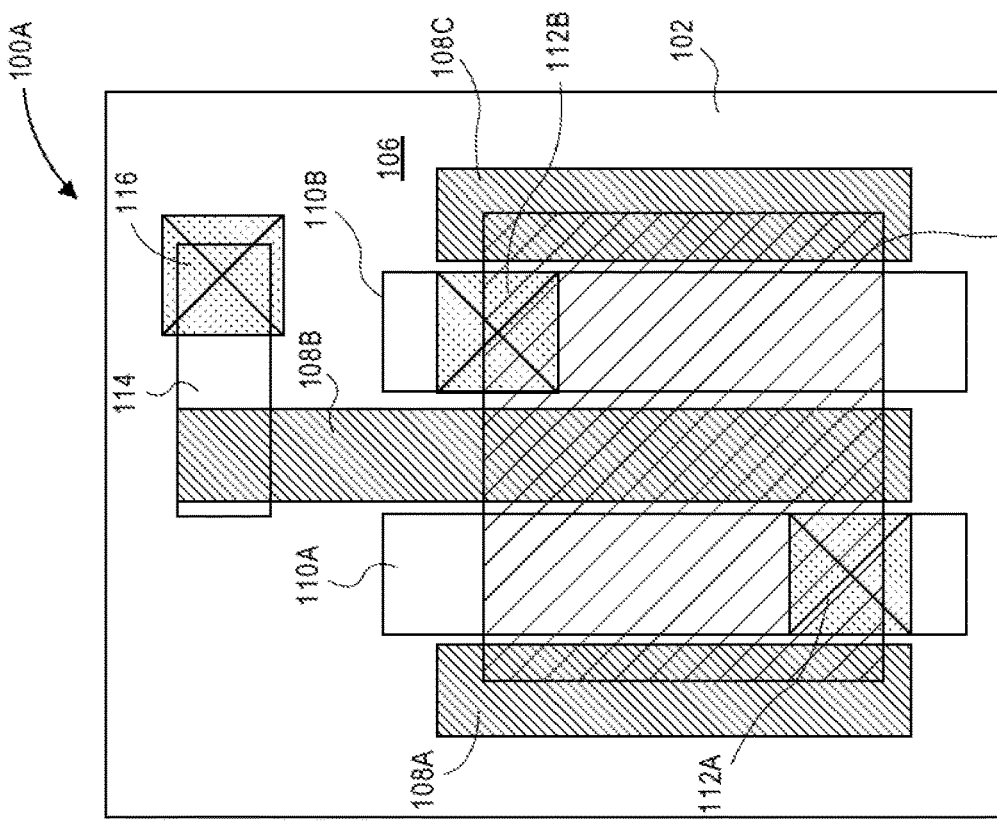
FIG. 1A illustrates a plan view of a semiconductor device having a gate contact disposed over an inactive portion of a gate electrode.

Referring to FIG. 1A, a semiconductor structure or device 100A includes a diffusion or active region 104 disposed in a substrate 102, and within an isolation region 106. One or more gate lines (also known as poly lines), such as gate lines 108A, 108B and 108C are disposed over the diffusion or active region 104 as well as over a portion of the isolation region 106. Source or drain contacts (also known as trench contacts), such as contacts 110A and 110B, are disposed over source and drain regions of the semiconductor structure or device 100A. Trench contact vias 112A and 112B provide contact to trench contacts 110A and 110B, respectively. A separate gate contact 114, and overlying gate contact via 116, provides contact to gate line 108B. In contrast to the source or drain trench contacts 110A or 110B, the gate contact 114 is disposed, from a plan view perspective, over isolation region 106, but not over diffusion or active region 104. Furthermore, neither the gate contact 114 nor gate contact via 116 is disposed between the source or drain trench contacts 110A and 110B.

Figure 1B:
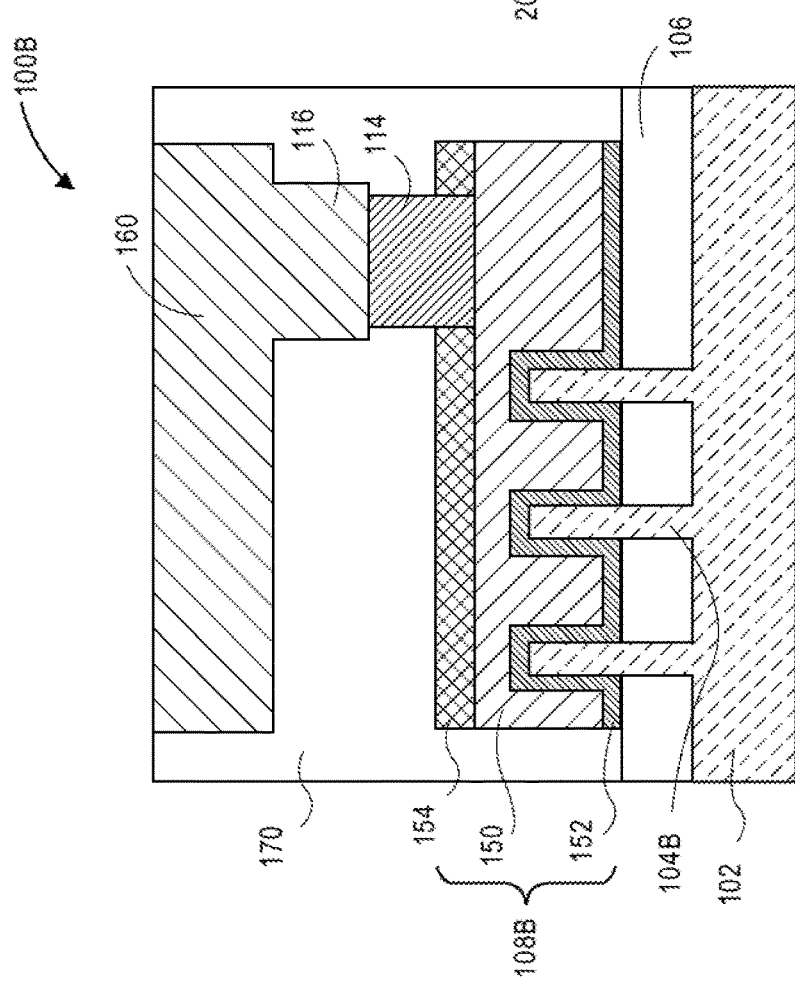
FIG. 1B illustrates a cross-sectional view of a non-planar semiconductor device having a gate contact disposed over an inactive portion of a gate electrode.

FIG. 1B illustrates a cross-sectional view of a non-planar semiconductor device having a gate contact disposed over an inactive portion of a gate electrode. Referring to FIG. 1B, a semiconductor structure or device 100B, e.g. a non-planar version of device 100A of FIG. 1A, includes a non-planar diffusion or active region 104B (e.g., a fin structure) formed from substrate 102, and within isolation region 106. Gate line 108B is disposed over the non-planar diffusion or active region 104B as well as over a portion of the isolation region 106. As shown, gate line 108B includes a gate electrode 150 and gate dielectric layer 152, along with a dielectric cap layer 154. Gate contact 114, and overlying gate contact via 116 are also seen from this perspective, along with an overlying metal interconnect 160, all of which are disposed in inter-layer dielectric stacks or layers 170. Also seen from the perspective of FIG. 1B, the gate contact 114 is disposed over isolation region 106, but not over non-planar diffusion or active region 104B.

Referring again to FIGS. 1A and 1B, the arrangement of semiconductor structure or device 100A and 100B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 2A illustrates a plan view of a semiconductor device having a gate contact via disposed over an active portion of a gate electrode, in accordance with an embodiment of the present disclosure. Referring to FIG. 2A, a semiconductor structure or device 200A includes a diffusion or active region 204 disposed in a substrate 202, and within an isolation region 206. One or more gate lines, such as gate lines 208A, 208B and 208C are disposed over the diffusion or active region 204 as well as over a portion of the isolation region 206. Source or drain trench contacts, such as trench contacts 210A and 210B, are disposed over source and drain regions of the semiconductor structure or device 200A. Trench contact vias 212A and 212B provide contact to trench contacts 210A and 210B, respectively. A gate contact via 216, with no intervening separate gate contact layer, provides contact to gate line 208B. In contrast to FIG. 1A, the gate contact 216 is disposed, from a plan view perspective, over the diffusion or active region 204 and between the source or drain contacts 210A and 210B.

Figure 2B:
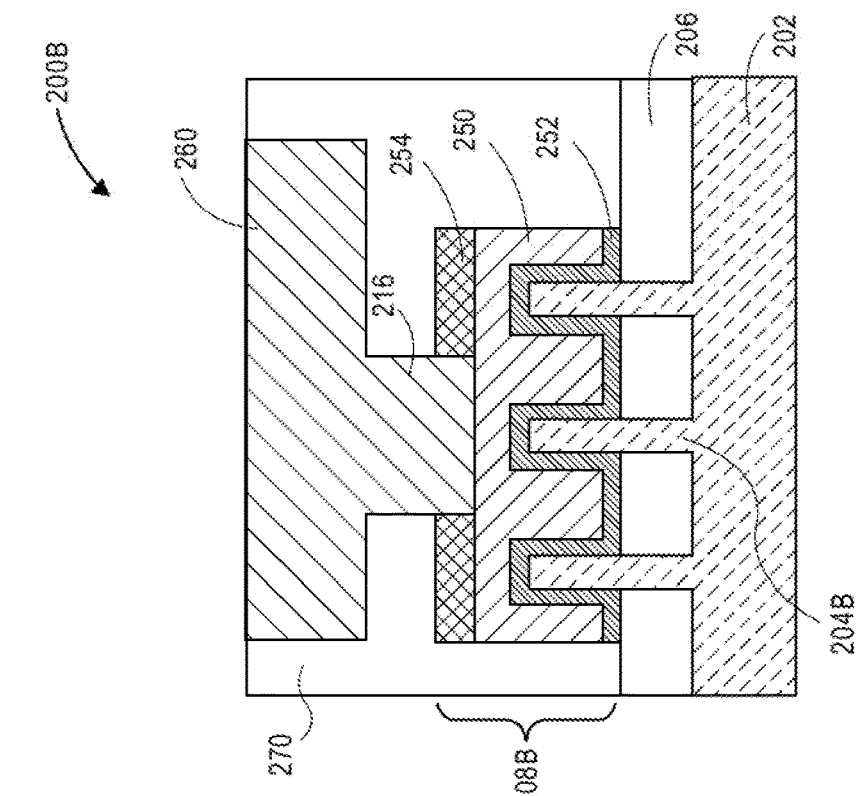
FIG. 2B illustrates a cross-sectional view of a non-planar semiconductor device having a gate contact via disposed over an active portion of a gate electrode, in accordance with an embodiment of the present disclosure.

FIG. 2B illustrates a cross-sectional view of a non-planar semiconductor device having a gate contact via disposed over an active portion of a gate electrode, in accordance with an embodiment of the present disclosure. Referring to FIG. 2B, a semiconductor structure or device 200B, e.g. a non-planar version of device 200A of FIG. 2A, includes a non-planar diffusion or active region 204B (e.g., a fin structure) formed from substrate 202, and within isolation region 206. Gate line 208B is disposed over the non-planar diffusion or active region 204B as well as over a portion of the isolation region 206. As shown, gate line 208B includes a gate electrode 250 and gate dielectric layer 252, along with a dielectric cap layer 254. The gate contact via 216 is also seen from this perspective, along with an overlying metal interconnect 260, both of which are disposed in inter-layer dielectric stacks or layers 270. Also seen from the perspective of FIG. 2B, the gate contact via 216 is disposed over non-planar diffusion or active region 204B.

Thus, referring again to FIGS. 2A and 2B, in an embodiment, trench contact vias 212A, 212B and gate contact via 216 are formed in a same layer and are essentially co-planar. In comparison to FIGS. 1A and 1B, the contact to the gate line would otherwise include and additional gate contact layer, e.g., which could be run perpendicular to the corresponding gate line. In the structure(s) described in association with FIGS. 2A and 2B, however, the fabrication of structures 200A and 200B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 200 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 208A and 208B surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 208A and 208B each completely surrounds the channel region.

Generally, one or more embodiments are directed to approaches for, and structures formed from, landing a gate contact via directly on an active transistor gate. Such approaches may eliminate the need for extension of a gate line on isolation for contact purposes. Particular embodiments may involve implementation of a metal shield to eliminate via to metal shorting, such as gate contact (GCN) to trench contact (TCN) shorting during formation of a gate contact in an opening in a gate insulating layer (GILA) cap.

In accordance with one or more embodiments of the present disclosure, selective growth of MOx (e.g., HfOx) is implemented to prevent shorting of via to "wrong" metal during via etch. Embodiments may be implemented to improve edge placement error margins of a via. In a particular embodiment, a gate via is protected from shorting to a source/drain via or trench contact structure. Selective deposition of an MOx (M=metal) hard mask on exposed source or drain metal surfaces prior to completing gate insulating layer breakthrough can be implemented to provide for relaxed edge placement errors for a gate via. The selectively grown metal oxide hard mask can serve both as an etch stop as well as an insulating layer preventing shorting to wrong (incorrect) metal structures during a contact fabrication process. Embodiments herein may involve selectively blocking deposition on adjacent dielectrics but not on an exposed metal surface.

Advantages of implementing embodiments described herein may include (1) enabling improvement in edge placement margin for gate vias (e.g., CD/overlay variation)

without using a separate etch stop for source/drain trench contact structures (e.g., without using a trench insulating layer, TILA, which can require costly metal recess, deposition, and polish operations), and/or (2) enabling larger gate via CD for lower resistance using a same overlay/litho CD uniformity requirement.

As an exemplary processing scheme involving fabrication of an on-target via, FIGS. 3A-3D illustrate top-down angled cross-sectional views illustrating various operations in a method of fabricating a contact over active gate (COAG) structure with a metal oxide layer having an on-target via, in accordance with an embodiment of the present disclosure.

Figure 3A:
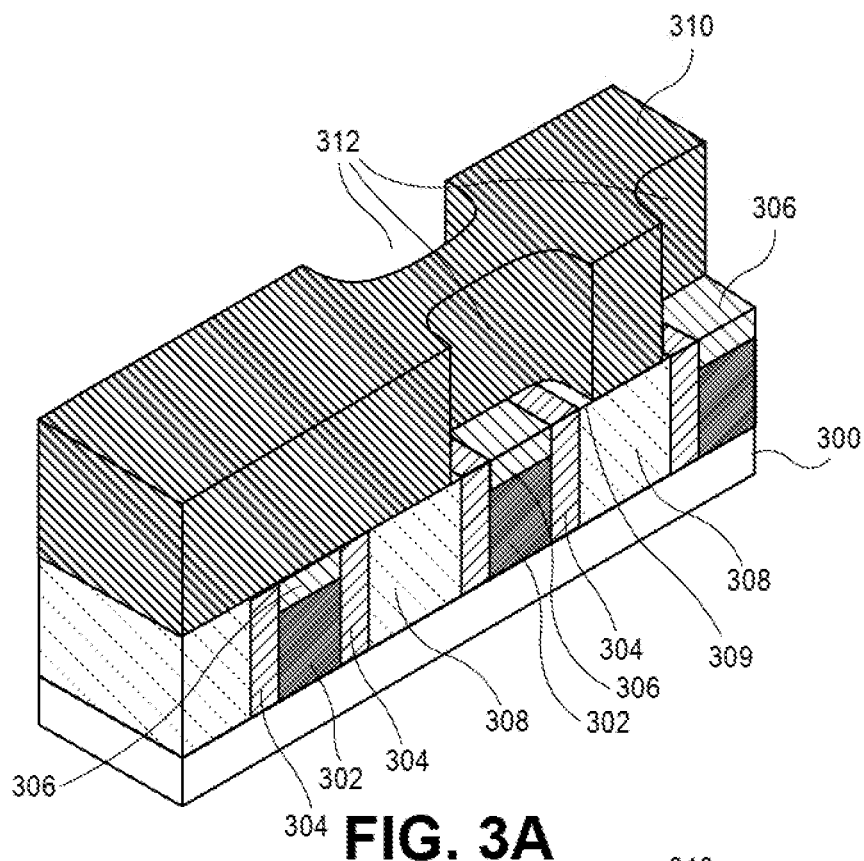
FIGS. 3A-3D illustrate top-down angled cross-sectional views illustrating various operations in a method of fabricating a contact over active gate (COAG) structure with a metal oxide layer having an on-target via, in accordance with an embodiment of the present disclosure.

Referring to FIG. 3A, a starting structure includes a plurality of gate structures 302 (e.g., structures including a gate dielectric and gate electrode) over a substrate 300 (such as a silicon substrate or silicon fin protruding from a silicon substrate). Dielectric sidewall spacers 304 are along sides of the gate structures 302. An insulating gate cap layer 306 (also referred to as a gate insulating layer, GILA) is on each gate structure 302 and between the dielectric sidewall spacers 304 associated with each gate structure 302. A conductive trench contact structure 308 is between the dielectric sidewall spacers 304 of adjacent gate structures 302. An inter-layer dielectric (ILD) layer 310 is over the gate structures 302 and conductive trench contact structures 308.

Openings 312 are in the ILD layer 310. The openings 312 expose portions of the plurality of gate structures 302 at locations where conductive gate contacts or vias are to make contact to an underlying gate structure 302. The formation of openings 312 can involve the use of the insulating gate cap layer 306 as an etch stop. As shown, in the case of a less constrained lithographic process, although centered, the openings 312 also expose a portion 309 of one or more adjacent trench contact structures 308. It is to be appreciated that a conductive contact ultimately formed in openings 312 would form a gate to trench contact short under such circumstances.

Figure 3B:
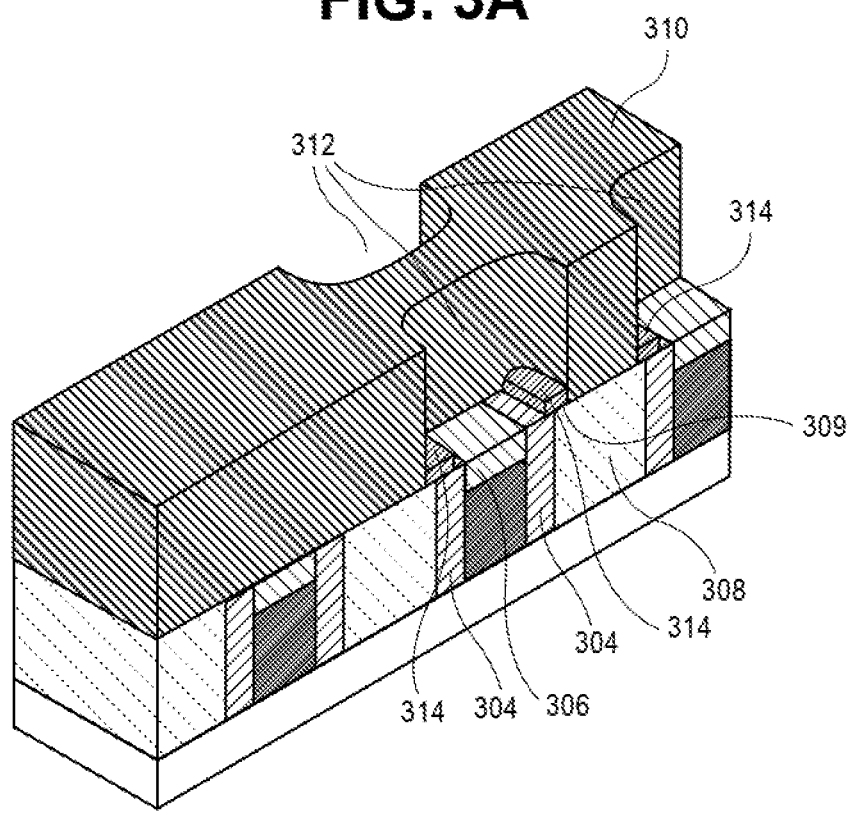

Referring to FIG. 3B, a metal oxide layer 314 (such as a layer of $HfO_2$) is selectively formed on the exposed portions 309 of the one or more adjacent trench contact structures 308. In one embodiment, as shown, the metal oxide layer 314 can "mushroom" over a portion of a corresponding dielectric sidewall spacer 304 adjacent the exposed portions 309 of the one or more adjacent trench contact structures 308. In another embodiment, the metal oxide layer 314 is confined to the exposed portions 309 of the one or more adjacent trench contact structures 308.

Figure 3C:
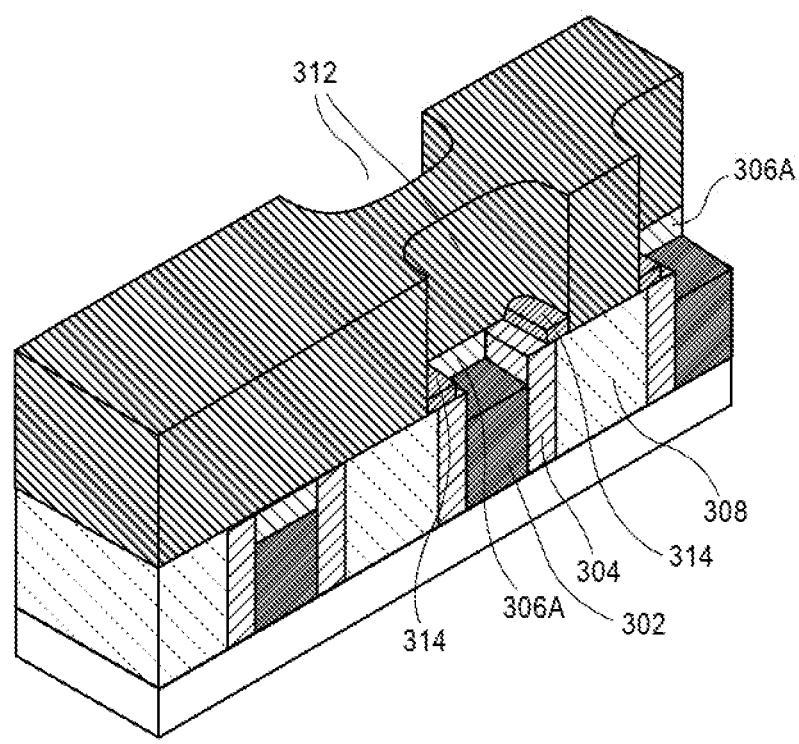

Referring to FIG. 3C, portions of the insulating gate cap layer 306 exposed by the openings 312 are etched to leave patterned insulating gate cap layer 306A with openings therein exposing portions of the underlying corresponding gate structures 302.

Figure 3D:
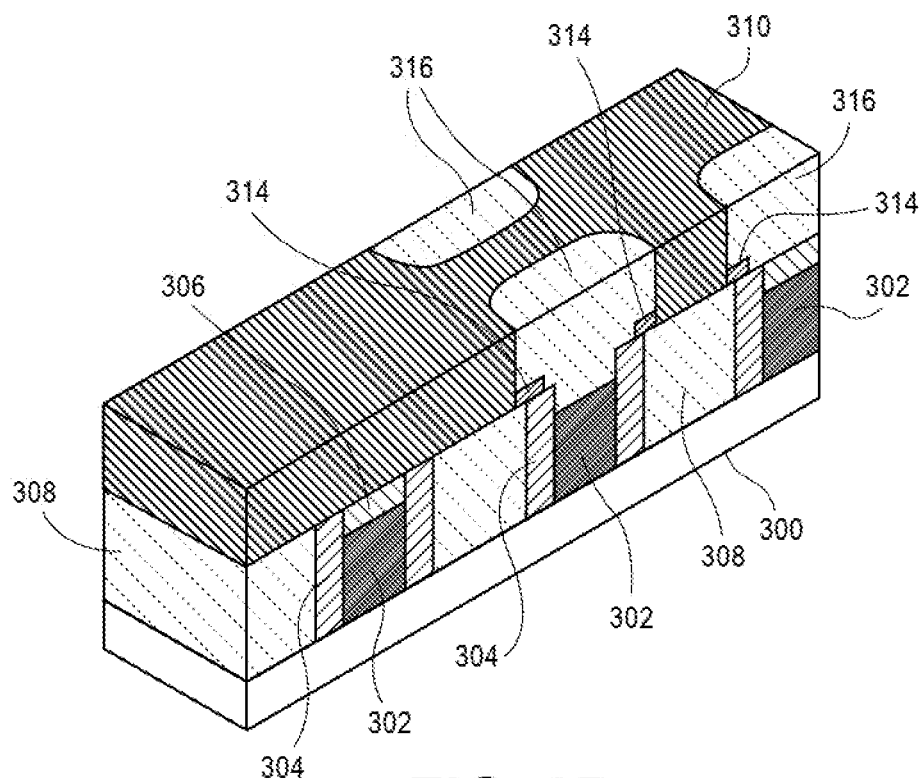

Referring to FIG. 3D, conductive gate contacts or vias 316 are formed in the openings 312 and in the openings of the patterned insulating gate cap layer 306A to make contact to the exposed portions of the underlying corresponding gate structures 302. The conductive gate contacts or vias 316 can be fabricated using a metal fill and planarization process. In an embodiment, the metal oxide layer 314 inhibits unwanted electrical contact between the conductive gate contacts or vias 316 and the exposed portions 309 of the one or more adjacent trench contact structures 308.

As an exemplary processing scheme involving fabrication of an off-target via, FIGS. 4A-4D illustrate top-down angled cross-sectional views illustrating various operations in a method of fabricating a contact over active gate (COAG) structure with a metal oxide layer having an off-target via, in accordance with an embodiment of the present disclosure.

Figure 4A:
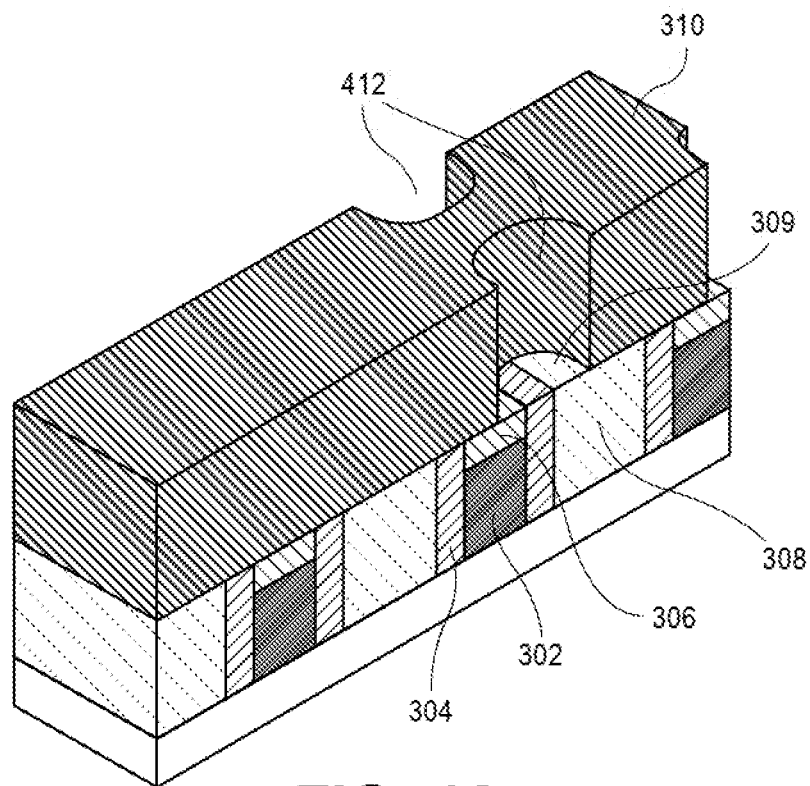
FIGS. 4A-4D illustrate top-down angled cross-sectional views illustrating various operations in a method of fabricating a contact over active gate (COAG) structure with a metal oxide layer having an off-target via, in accordance with an embodiment of the present disclosure.

Referring to FIG. 4A, a starting structure includes a plurality of gate structures 302 (e.g., structures including a gate dielectric and gate electrode) over a substrate 300 (such as a silicon substrate or silicon fin protruding from a silicon substrate). Dielectric sidewall spacers 304 are along sides of the gate structures 302. An insulating gate cap layer 306 (also referred to as a gate insulating layer, GILA) is on each gate structure 302 and between the dielectric sidewall spacers 304 associated with each gate structure 302. A conductive trench contact structure 308 is between the dielectric sidewall spacers 304 of adjacent gate structures 302. An inter-layer dielectric (ILD) layer 310 is over the gate structures 302 and conductive trench contact structures 308.

Openings 412 are in the ILD layer 310. The openings 412 expose portions of the plurality of gate structures 302 at locations where conductive gate contacts or vias are to make contact to an underlying gate structure 302. The formation of openings 412 can involve the use of the insulating gate cap layer 306 as an etch stop. As shown, in the case of a less constrained lithographic process, which is furthermore off-centered, the openings 412 also expose a portion 309 of one or more adjacent trench contact structures 308. It is to be appreciated that a conductive contact ultimately formed in openings 412 would form a gate to trench contact short under such circumstances.

Figure 4B:
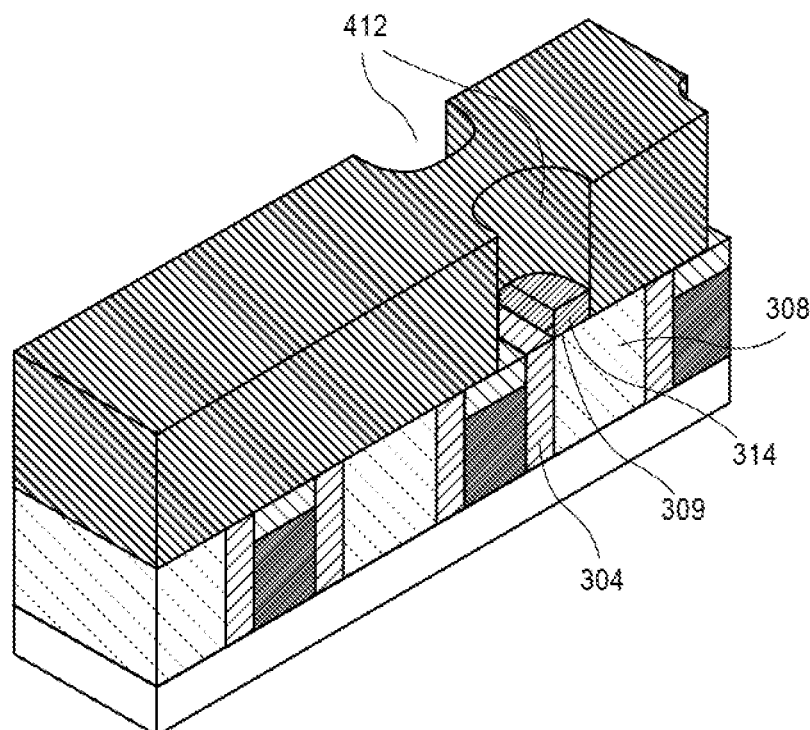

Referring to FIG. 4B, a metal oxide layer 314 (such as a layer of $HfO_2$) is selectively formed on the exposed portions 309 of the one or more adjacent trench contact structures 308. In one embodiment, as shown, the metal oxide layer 314 is confined to the exposed portions 309 of the one or more adjacent trench contact structures 308. In another embodiment, the metal oxide layer 314 can "mushroom" over a portion of a corresponding dielectric sidewall spacers 304 adjacent the exposed portions 309 of the one or more adjacent trench contact structures 308.

Figure 4C:
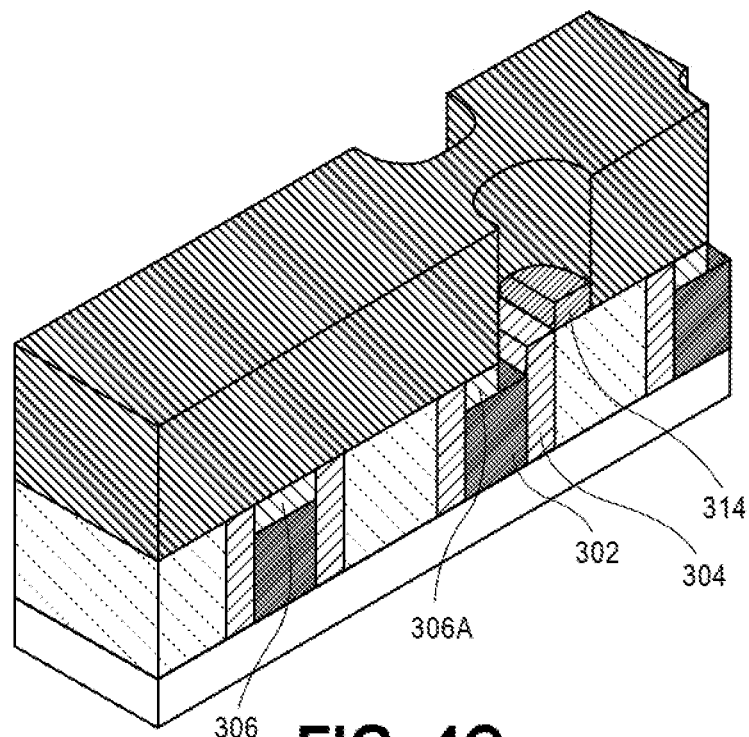

Referring to FIG. 4C, portions of the insulating gate cap layer 306 exposed by the openings 412 are etched to leave patterned insulating gate cap layer 306A with openings therein exposing portions of the underlying corresponding gate structures 302.

Figure 4D:
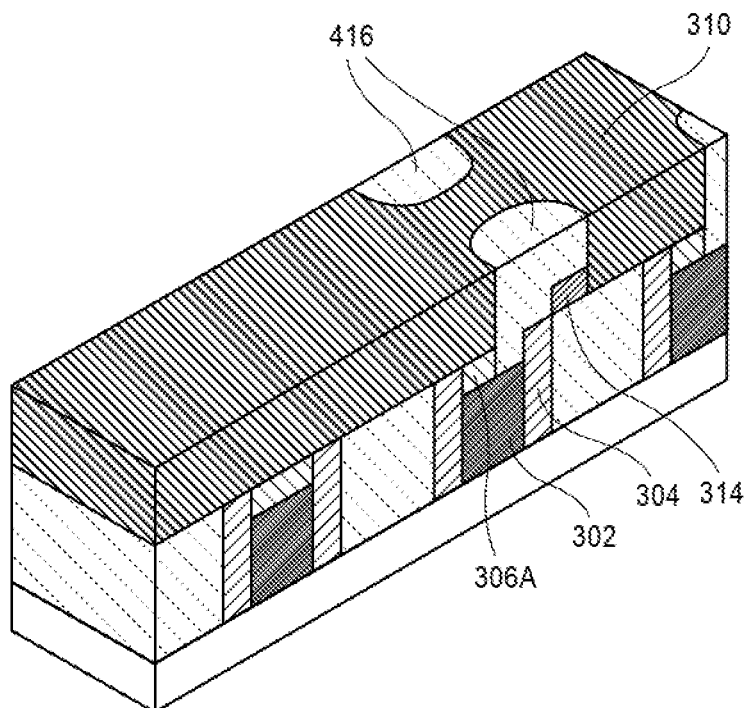

Referring to FIG. 4D, conductive gate contacts or vias 416 are formed in the openings 412 and in the openings of the patterned insulating gate cap layer 306A to make contact to the exposed portions of the underlying corresponding gate structures 302. The conductive gate contacts or vias 416 can be fabricated using a metal fill and planarization process. In an embodiment, the metal oxide layer 314 inhibits unwanted electrical contact between the conductive gate contacts or vias 416 and the exposed portions 309 of the one or more adjacent trench contact structures 308.

With reference again to FIGS. 3D and 4D, in accordance with an embodiment of the present disclosure, an integrated circuit structure includes a plurality of gate structures 302 above substrate 300, each of the gate structures 302 including a gate insulating layer 306 thereon. A plurality of conductive trench contact structures 308 is alternating with the plurality of gate structures 302. A portion 309 of one of the plurality of trench contact structures 308 has a metal oxide layer 314 thereon. An interlayer dielectric material 310 is over the plurality of gate structures 302 and over the plurality of conductive trench contact structures 308. An opening (312 and corresponding opening in 306A) is in the interlayer dielectric material 310 and in a gate insulating layer 306 of a corresponding one of the plurality of gate structures 302. A conductive via 316 is in the opening (312 and corresponding opening in 306A). The conductive via 316 in direct contact with the corresponding one of the plurality of gate structures 302. The conductive via 316 is also on the metal oxide layer 314.

In an embodiment, the conductive via 316 is on-set with the one of the plurality of gate structures 302, as is depicted in FIG. 3D. In another embodiment, the conductive via 416 is off-set with the one of the plurality of gate structures 302, as is depicted in FIG. 4D.

In an embodiment, the integrated circuit structure further includes a plurality of dielectric spacers 304 alternating with the plurality of gate structures 302 and the plurality of conductive trench contact structures 308. In one such embodiment, the metal oxide layer 314 is over a portion of one of the plurality of dielectric sidewall spacers 304 beneath the conductive via 316, as is depicted in FIG. 3D. In another such embodiment, the metal oxide layer 314 is not over a portion of one of the plurality of dielectric sidewall spacers 304 beneath the conductive via 416, as is depicted in FIG. 4D.

In an embodiment, the metal oxide layer 314 is selected from the group consisting of AlOx, HfOx, ZrOx, TiOx, $Y_2O_3$, and $Al_2O_3$-doped SiOx. In an alternative embodiment, HfN or AlN are used for the material of 314. In an embodiment, the plurality of conductive trench contact structures 308 and the plurality of gate structures 302 are on a semiconductor fin.

Disclosed herein are two process flow options for fabricating metal oxide layer 314 described above. In a first option, selective growth is performed immediately inside of a via region. In a second option, selective growth is performed prior to hard mask deposition.

In an exemplary first option, FIGS. 5A-5D illustrate cross-sectional views illustrating various operations in a method of fabricating a contact over active gate (COAG) structure with a metal oxide layer, in accordance with an embodiment of the present disclosure.

Figure 5A:
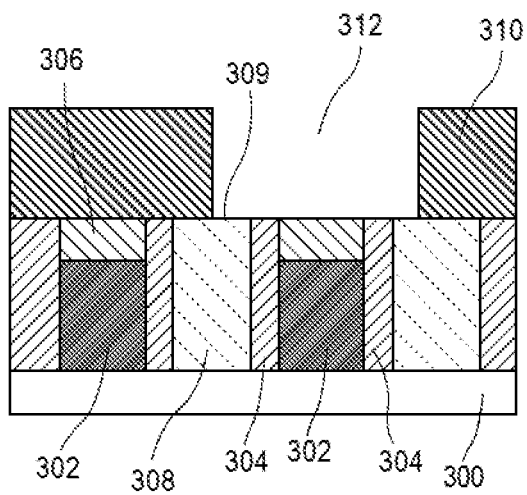
FIGS. 5A-5D illustrate cross-sectional views illustrating various operations in a method of fabricating a contact over active gate (COAG) structure with a metal oxide layer, in accordance with an embodiment of the present disclosure.

Referring to FIG. 5A, a starting structure includes a plurality of gate structures 302 (e.g., structures including a gate dielectric and gate electrode) over a substrate 300 (such as a silicon substrate or silicon fin protruding from a silicon substrate). Dielectric sidewall spacers 304 are along sides of the gate structures 302. An insulating gate cap layer 306 (also referred to as a gate insulating layer, GILA) is on each gate structure 302 and between the dielectric sidewall spacers 304 associated with each gate structure 302. A conductive trench contact structure 308 is between the dielectric sidewall spacers 304 of adjacent gate structures 302. An inter-layer dielectric (ILD) layer 310 is over the gate structures 302 and conductive trench contact structures 308.

An opening 312 is in the ILD layer 310. The opening 312 exposes a portion of one of the plurality of gate structures 302 at a location where a conductive gate contact or via is to make contact to an underlying gate structure 302. The formation of opening 312 can involve the use of the insulating gate cap layer 306 as an etch stop. As shown, in the case of a less constrained lithographic process, although centered, the opening 312 also exposes portions 309 of two adjacent trench contact structures 308. It is to be appreciated that a conductive contact ultimately formed in opening 312 would form a gate to trench contact short under such circumstances.

Figure 5B:
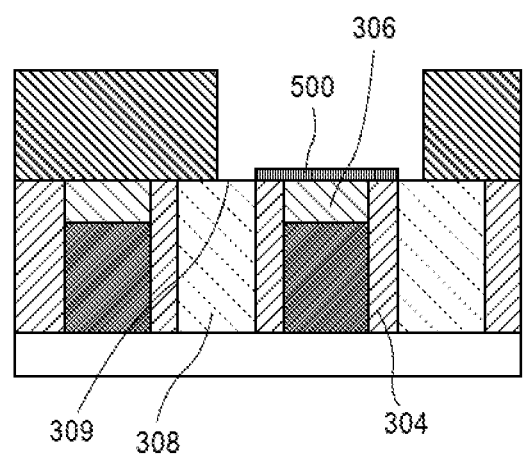

Referring to FIG. 5B, a growth blocking layer 500, such as a self-assembled monolayer (SAM), is formed on the exposed surfaces of the insulating gate cap layer 306 and the dielectric sidewall spacers 304 (i.e., on the dielectric surfaces) but not on the exposed surfaces 309 of the two adjacent trench contact structures 308. In one embodiment, the growth blocking layer 500 is or includes a material selected from the group consisting of $SiO_2$, Al-doped $SiO_2$, SiN, SiC, SiCN and SiCON.

Figure 5C:
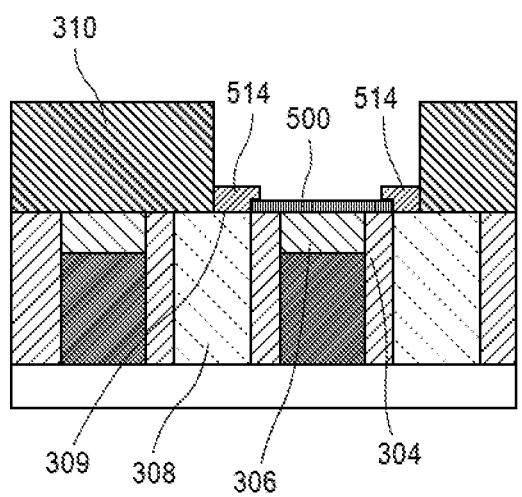

Referring to FIG. 5C, a metal oxide layer 514 is selectively grown on the exposed surfaces 309 of the two adjacent trench contact structures 308 but not on the growth blocking layer 500. In one embodiment, the metal oxide layer 514 is or includes hafnium oxide, zirconium oxide, titanium oxide, aluminum oxide, or the like. In one embodiment, the metal oxide layer 514 has overhang portions 514A where lateral overgrowth occurs.

Figure 5D:
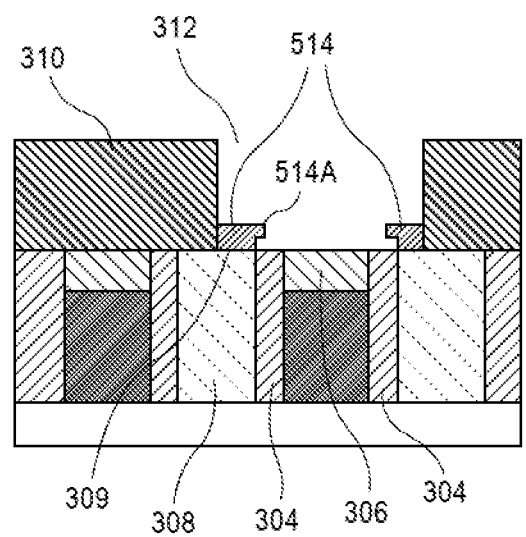

Referring to FIG. 5D, the growth blocking layer 500 is removed, leaving the metal oxide layer 514 on and covering the exposed surfaces 309 of the two adjacent trench contact structures 308. In one embodiment, the metal oxide layer 514 includes overhang portions 514A.

In an exemplary second option, FIGS. 6A-6D illustrate cross-sectional views illustrating various operations in a method of fabricating a contact over active gate (COAG) structure with a metal oxide layer, in accordance with an embodiment of the present disclosure.

Figure 6A:
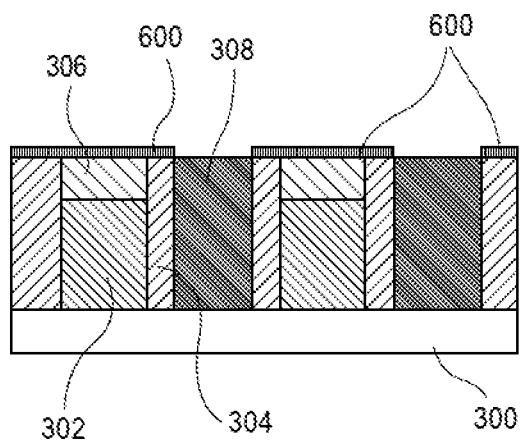
FIGS. 6A-6D illustrate cross-sectional views illustrating various operations in a method of fabricating a contact over active gate (COAG) structure with a metal oxide layer, in accordance with an embodiment of the present disclosure.

Referring to FIG. 6A, a starting structure includes a plurality of gate structures 302 (e.g., structures including a gate dielectric and gate electrode) over a substrate 300 (such as a silicon substrate or silicon fin protruding from a silicon substrate). Dielectric sidewall spacers 304 are along sides of the gate structures 302. An insulating gate cap layer 306 (also referred to as a gate insulating layer, GILA) is on each gate structure 302 and between the dielectric sidewall spacers 304 associated with each gate structure 302. A conductive trench contact structure 308 is between the dielectric sidewall spacers 304 of adjacent gate structures 302. A growth blocking layer 600, such as a self-assembled monolayer (SAM), is formed on the exposed surfaces of the insulating gate cap layer 306 and the dielectric sidewall spacers 304 (i.e., on the dielectric surfaces) but not on the trench contact structures 308. In one embodiment, the growth blocking layer 600 is or includes a material selected from the group consisting of $SiO_2$, Al-doped $SiO_2$, SiN, SiC, SiCN and SiCON.

Figure 6B:
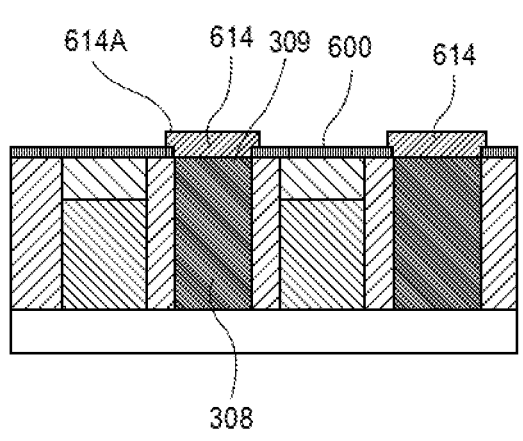

Referring to FIG. 6B, a metal oxide layer 614 is selectively grown on the exposed surfaces 309 of the two adjacent trench contact structures 308 but not on the growth blocking layer 600. In one embodiment, the metal oxide layer 614 is or includes hafnium oxide, zirconium oxide, titanium oxide, aluminum oxide, or the like. In one embodiment, the metal oxide layer 614 has overhang portions 614A where lateral overgrowth occurs.

Figure 6C:
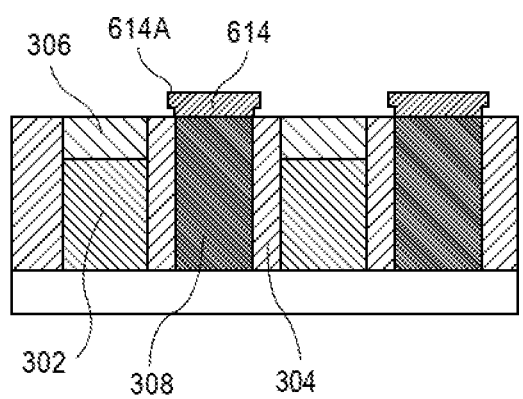

Referring to FIG. 6C, the growth blocking layer 600 is removed, leaving the metal oxide layer 614 on and covering the trench contact structures 308. In one embodiment, the metal oxide layer 614 includes overhang portions 614A.

Figure 6D:
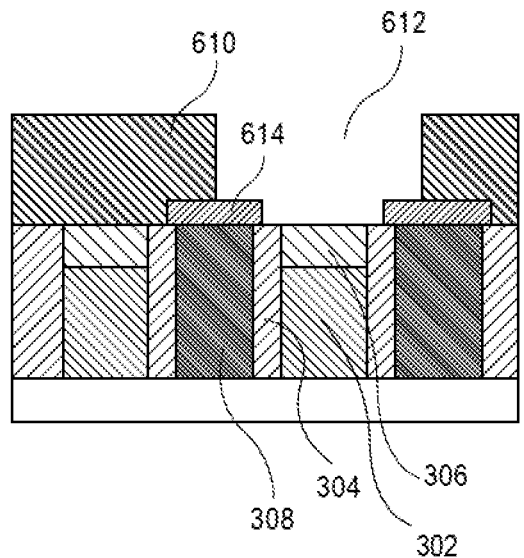

Referring to FIG. 6D, an inter-layer dielectric (ILD) layer 610 is formed over the structure of FIG. 6C. An opening 612 is lithographically patterned in the ILD layer 610. The opening 612 exposes a portion of one of the plurality of gate structures 302 at a location where a conductive gate contact or via is to make contact to an underlying gate structure 302. The formation of opening 612 can involve the use of the insulating gate cap layer 306 as an etch stop. As shown, in the case of a less constrained lithographic process, although centered, the opening 612 also exposes the metal oxide layer 614. It is to be appreciated that a conductive contact ultimately formed in opening 612 is inhibited by the metal oxide layer 614 from forming a gate to trench contact short.

In another aspect, a selective umbrella for isolating a gate contact (GCN) from an overlying metal grating is described. In an embodiment, selective growth of MOx (e.g., HfOx) enables isolation of a GCN from a metal grating above, without design rule restrictions. For example, a self-assembled monolayer (SAM) can be selectively deposited on an exposed ILD rendering it hydrophobic. The SAM layer may block ALD deposition on the ILD to enable formation of an insulating cap selectively on GCN.

In an exemplary processing scheme, FIGS. 7A-7D illustrate top-down angled cross-sectional views illustrating various operations in a method of isolating a gate contact layer from an overlying metal grating, in accordance with an embodiment of the present disclosure.

Figure 7A:
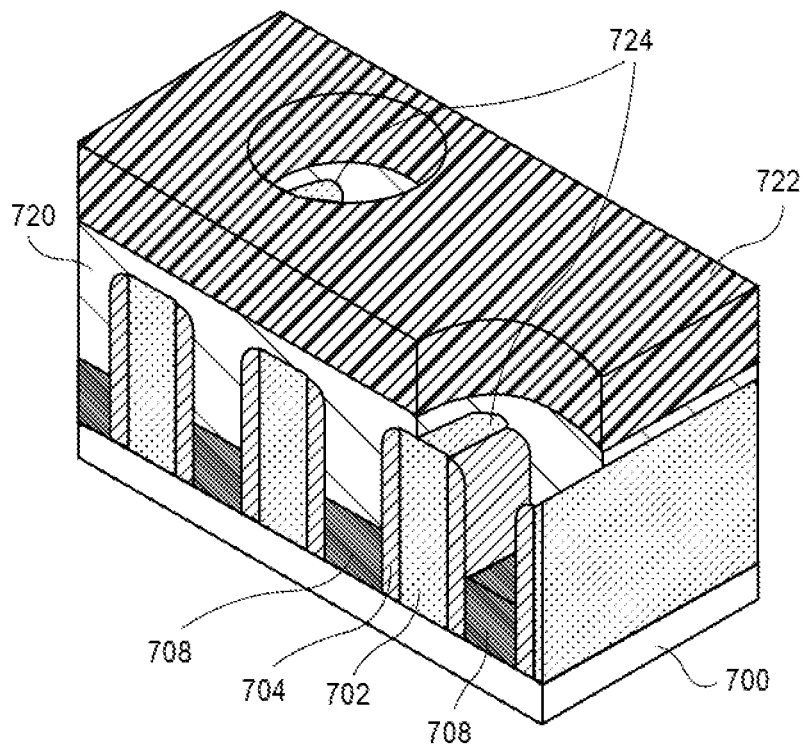
FIGS. 7A-7D illustrate top-down angled cross-sectional views illustrating various operations in a method of isolating a gate contact layer from an overlying metal grating, in accordance with an embodiment of the present disclosure.

Referring to FIG. 7A, a starting structure includes a plurality of gate structures 708 (e.g., structures including a gate dielectric and gate electrode) over a substrate 700 (such as a silicon substrate or silicon fin protruding from a silicon substrate). Dielectric sidewall spacers 704 are along sides of the gate structures 708. An insulating gate cap layer 720 (also referred to as a gate insulating layer, GILA) is over the gate structures 708. A conductive trench contact structure 702 is between the dielectric sidewall spacers 704 of adjacent gate structures 708. An inter-layer dielectric (ILD) layer 722 is over the insulating gate cap layer 720. In an embodiment, the ILD layer 722 includes a top growth blocking layer, such as a self-assembled monolayer (SAM). In one embodiment, the growth blocking layer is or includes a material selected from the group consisting of $SiO_2$, Al-doped $SiO_2$, SiN, SiC, SiCN and SiCON. Openings 724 are in the ILD layer 722. The openings 724 expose portions of the plurality of gate structures 708 at locations where conductive gate contacts or vias are to make contact to an underlying gate structure 708.

Figure 7B:
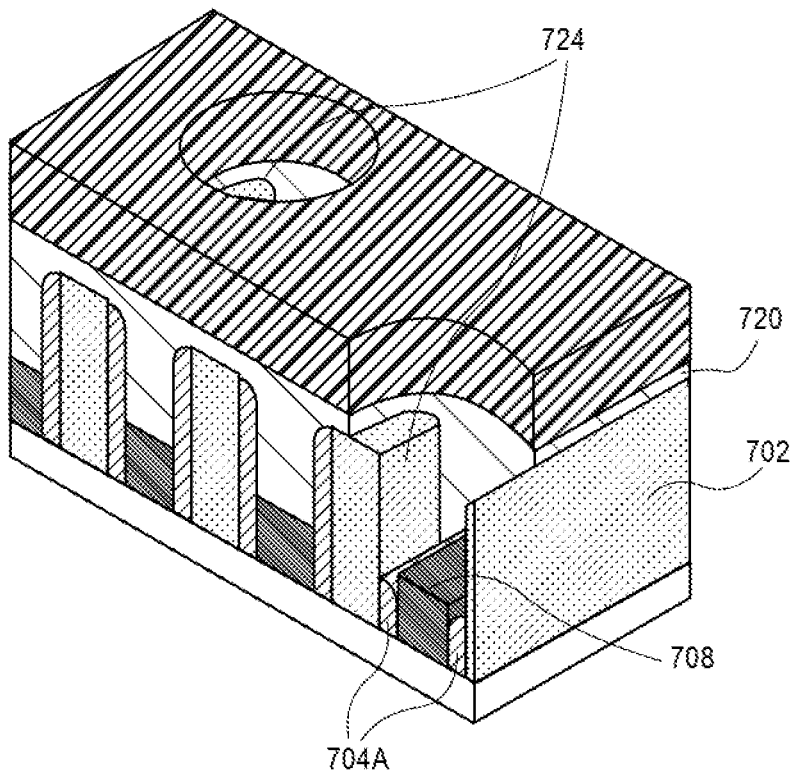

Referring to FIG. 7B, exposed portions of the dielectric sidewall spacers 704 are recessed to form recessed spacers 704A.

Figure 7C:
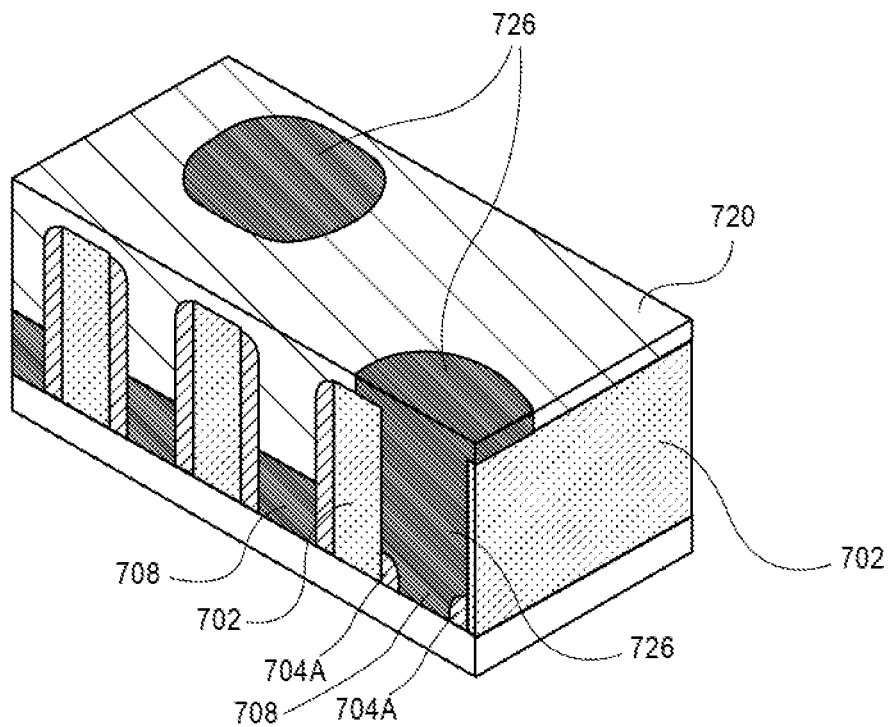

Referring to FIG. 7C, conductive gate contacts or vias 726 are formed in the openings 724 including on the recessed spacers 704A. The process may involve planarization which removes a portion or all of the ILD layer 722, as depicted.

Figure 7D:
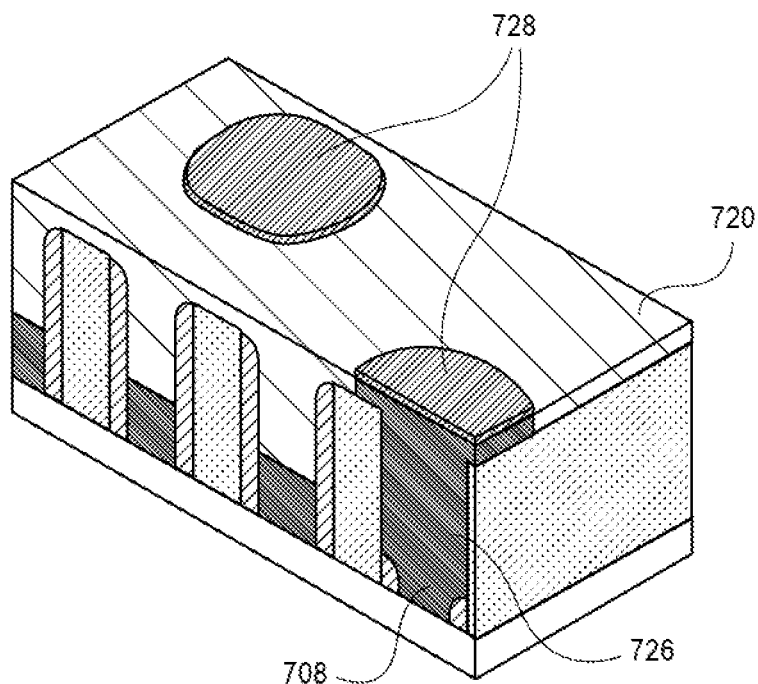

Referring to FIG. 7D, a metal oxide layer 728 (such as a layer of $HfO_2$) is selectively formed on the conductive gate contacts or vias 726. The metal oxide layer 728 can inhibit unwanted shorting of the conductive gate contacts or vias 726 to overlying conductive structures subsequently formed.

With reference again to FIG. 7D, in accordance with an embodiment of the present disclosure, an integrated circuit structure includes a plurality of gate structures 708 above substrate. A plurality of conductive trench contact structures 702 is alternating with the plurality of gate structures 708. An insulating layer 720 is over the plurality of gate structures 708 and over the plurality of conductive trench contact structures 702. An opening is in the insulating layer 720. A conductive via 726 is in the opening, the conductive via 726 in direct contact with one of the plurality of gate structures 708, and the conductive via 726 having a top surface. A metal oxide layer 728 is on and covers the top surface of the conductive via 726.

In an embodiment, the metal oxide layer 728 is selected from the group consisting of AlOx, HfOx, ZrOx, and TiOx. In an embodiment, the plurality of conductive trench contact structures 702 and the plurality of gate structures 708 are on a semiconductor fin.

The approaches and structures described herein may enable formation of other structures or devices that were not possible or difficult to fabricate using other methodologies.

Figure 8A:
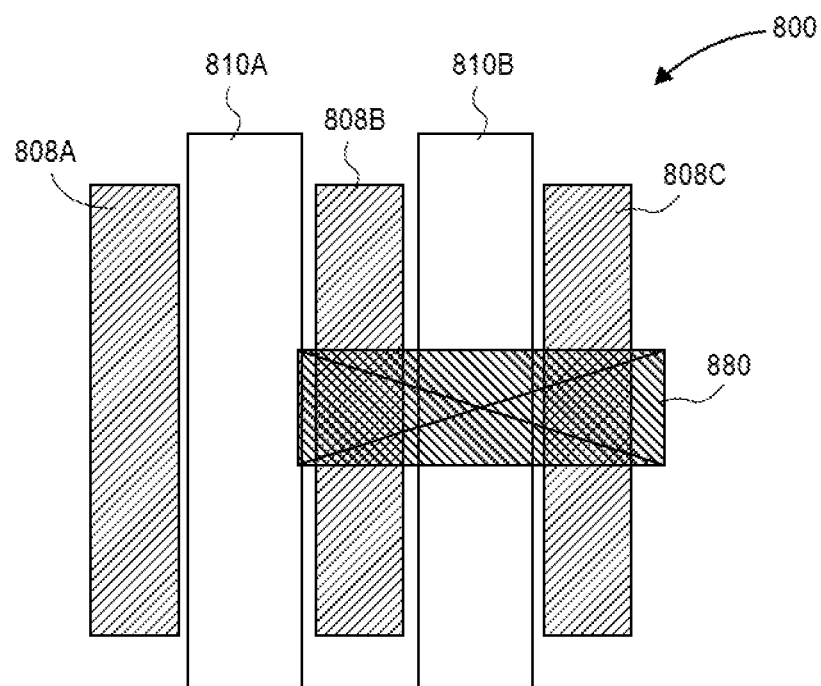
FIG. 8A illustrates a plan view of another semiconductor device having a gate contact via disposed over an active portion of a gate, in accordance with another embodiment of the present disclosure.

In a first example, FIG. 8A illustrates a plan view of another semiconductor device having a gate contact via disposed over an active portion of a gate, in accordance with another embodiment of the present disclosure. Referring to FIG. 8A, a semiconductor structure or device 800 includes a plurality of gate structures 808A-808C interdigitated with a plurality of trench contacts 810A and 810B (these features are disposed above an active region of a substrate, not shown). A gate contact via 880 is formed on an active portion the gate structure 808B. The gate contact via 880 is further disposed on the active portion of the gate structure 808C, coupling gate structures 808B and 808C. It is to be appreciated that the intervening trench contact 810B may be isolated from the contact 880 by using an intervening metal oxide layer as described above. The contact configuration of FIG. 8A may provide an easier approach to strapping adjacent gate lines in a layout, without the need to route the strap through upper layers of metallization, hence enabling smaller cell areas or less intricate wiring schemes, or both.

Figure 8B:
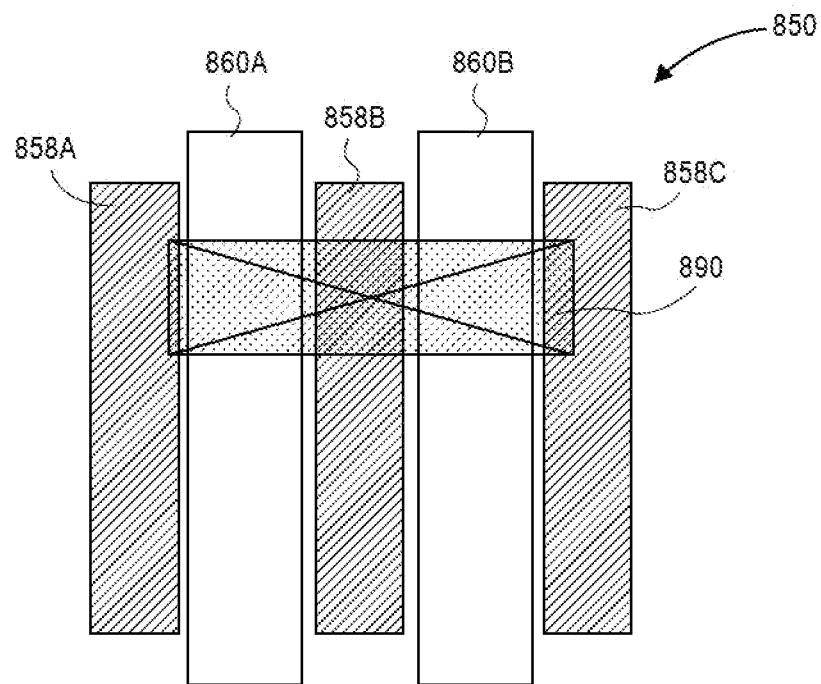
FIG. 8B illustrates a plan view of another semiconductor device having a trench contact via coupling a pair of trench contacts, in accordance with another embodiment of the present disclosure.

In a second example, FIG. 8B illustrates a plan view of another semiconductor device having a trench contact via coupling a pair of trench contacts, in accordance with another embodiment of the present disclosure. Referring to FIG. 8B, a semiconductor structure or device 850 includes a plurality of gate structures 858A-858C interdigitated with a plurality of trench contacts 860A and 860B (these features are disposed above an active region of a substrate, not shown). A trench contact via 890 is formed on the trench contact 860A. The trench contact via 890 is further disposed on the trench contact 860B, coupling trench contacts 860A and 860B. It is to be appreciated that the intervening gate structure 858B may be isolated from the trench contact via 890 by using a gate isolation cap layer (e.g., by a GILA process). The contact configuration of FIG. 8B may provide an easier approach to strapping adjacent trench contacts in a layout, without the need to route the strap through upper layers of metallization, hence enabling smaller cell areas or less intricate wiring schemes, or both.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a predefined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
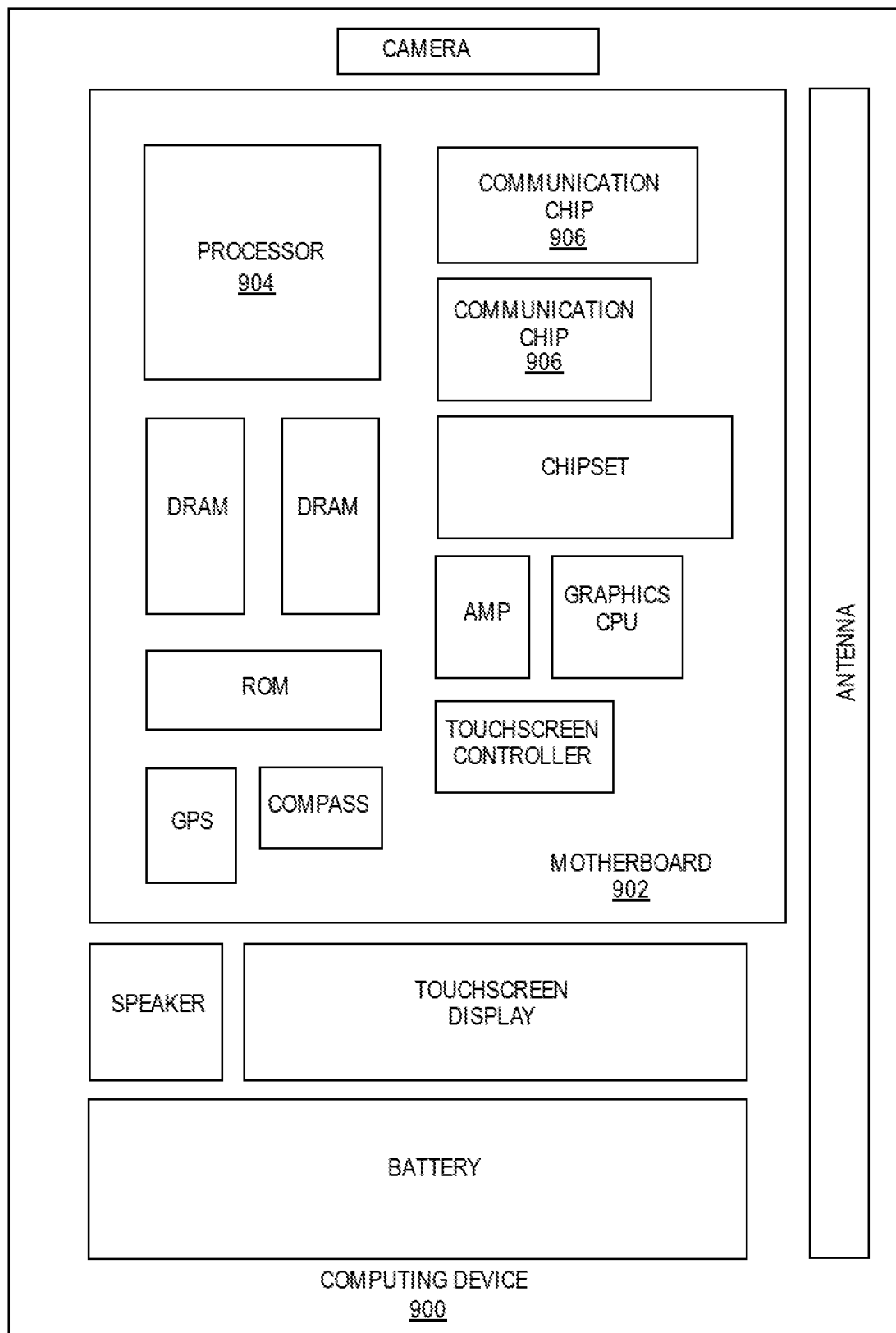
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of embodiments of the disclosure, the integrated circuit die of the processor 904 includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 906 also includes an integrated circuit die packaged within the communication chip 906. In accordance with another implementation of the disclosure, the integrated circuit die of the communication chip 906 is built in accordance with implementations of the disclosure.

In further implementations, another component housed within the computing device 900 may contain an integrated circuit die built in accordance with implementations of embodiments of the disclosure.

In various embodiments, the computing device 900 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
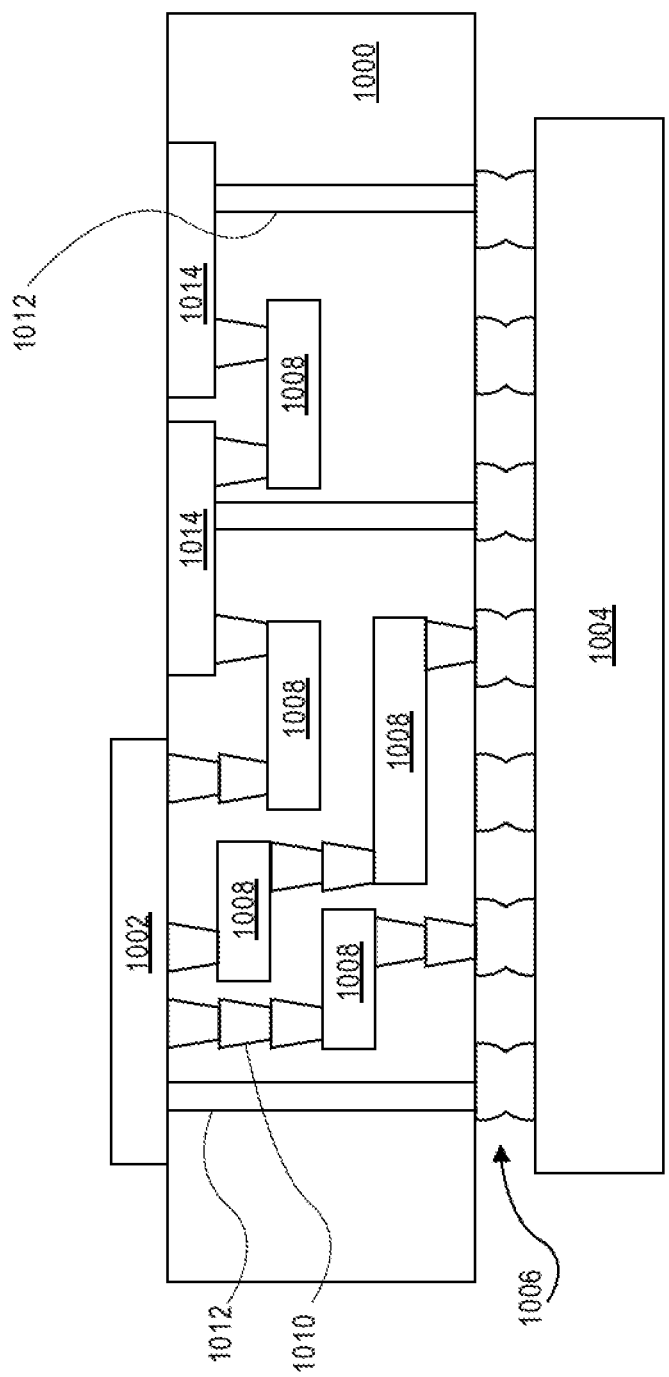
FIG. 10 illustrates an interposer that includes one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/

1004 are attached to the same side of the interposer 1000. And, in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Figure 11:
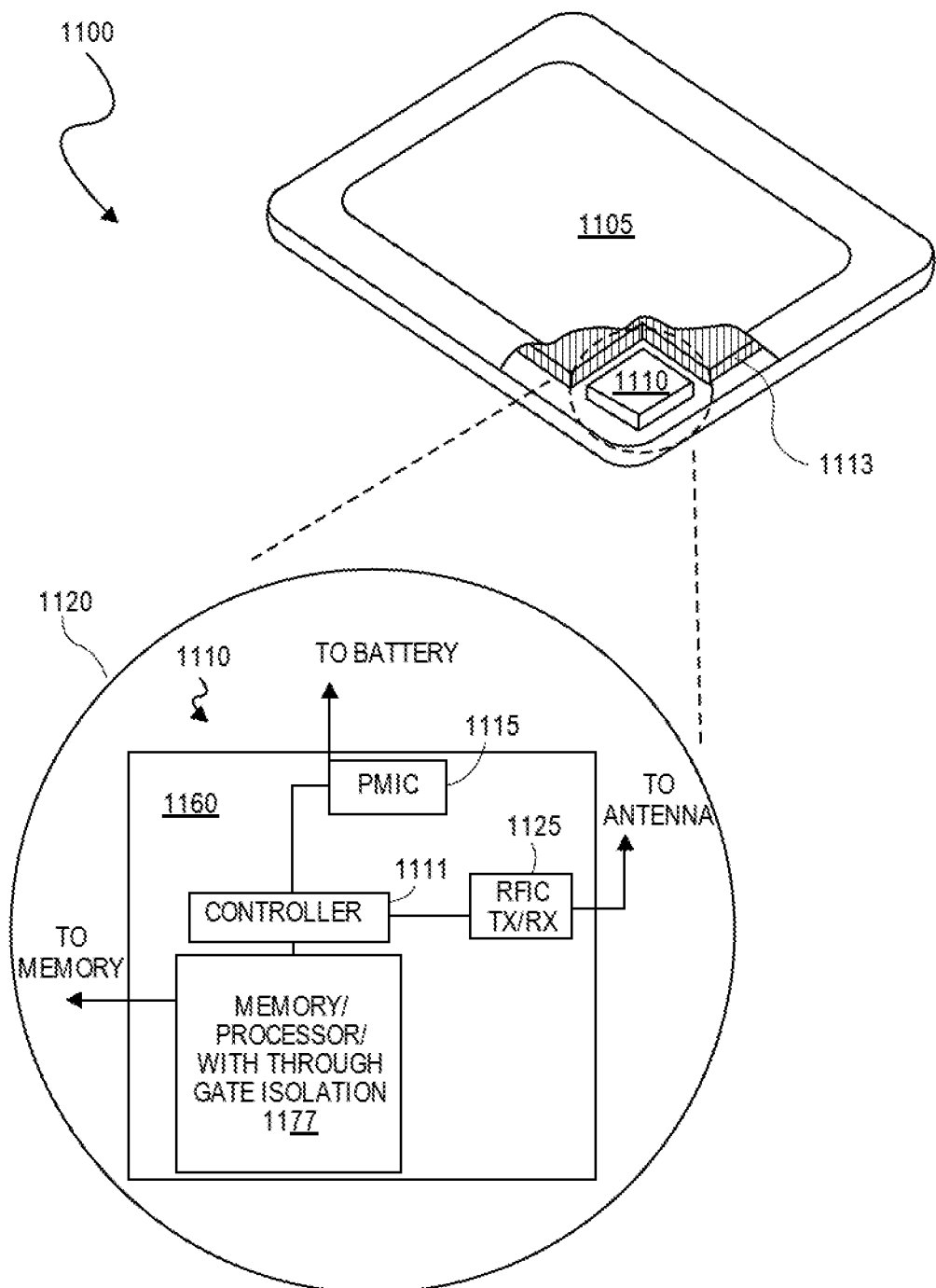
FIG. 11 is an isometric view of a mobile computing platform employing an IC fabricated according to one or more processes described herein or including one or more features described herein, in accordance with an embodiment of the present disclosure.

FIG. 11 is an isometric view of a mobile computing platform 1100 employing an integrated circuit (IC) fabricated according to one or more processes described herein or including one or more features described herein, in accordance with an embodiment of the present disclosure.

The mobile computing platform 1100 may be any portable device configured for each of electronic data display, electronic data processing, and wireless electronic data transmission. For example, mobile computing platform 1100 may be any of a tablet, a smart phone, laptop computer, etc. and includes a display screen 1105 which in the exemplary embodiment is a touchscreen (capacitive, inductive, resistive, etc.), a chip-level (SoC) or package-level integrated system 1110, and a battery 1113. As illustrated, the greater the level of integration in the integrated system 1110 enabled by higher transistor packing density, the greater the portion of the mobile computing platform 1100 that may be occupied by the battery 1113 or non-volatile storage, such as a solid state drive, or the greater the transistor gate count for improved platform functionality. Similarly, the greater the carrier mobility of each transistor in the integrated system 1110, the greater the functionality. As such, techniques described herein may enable performance and form factor improvements in the mobile computing platform 1100.

The integrated system 1110 is further illustrated in the expanded view 1120. In the exemplary embodiment, packaged device 1177 includes at least one memory chip (e.g., RAM), or at least one processor chip (e.g., a multi-core microprocessor and/or graphics processor) fabricated according to one or more processes described herein or including one or more features described herein. The packaged device 1177 is further coupled to the board 1160 along with one or more of a power management integrated circuit (PMIC) 1115, RF (wireless) integrated circuit (RFIC) 1125 including a wideband RF (wireless) transmitter and/or receiver (e.g., including a digital baseband and an analog front end module further includes a power amplifier on a transmit path and a low noise amplifier on a receive path), and a controller thereof 1111. Functionally, the PMIC 1115 performs battery power regulation, DC-to-DC conversion, etc., and so has an input coupled to the battery 1113 and with an output providing a current supply to all the other functional modules. As further illustrated, in the exemplary embodiment, the RFIC 1125 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1177 or within a single IC (SoC) coupled to the package substrate of the packaged device 1177.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 12:
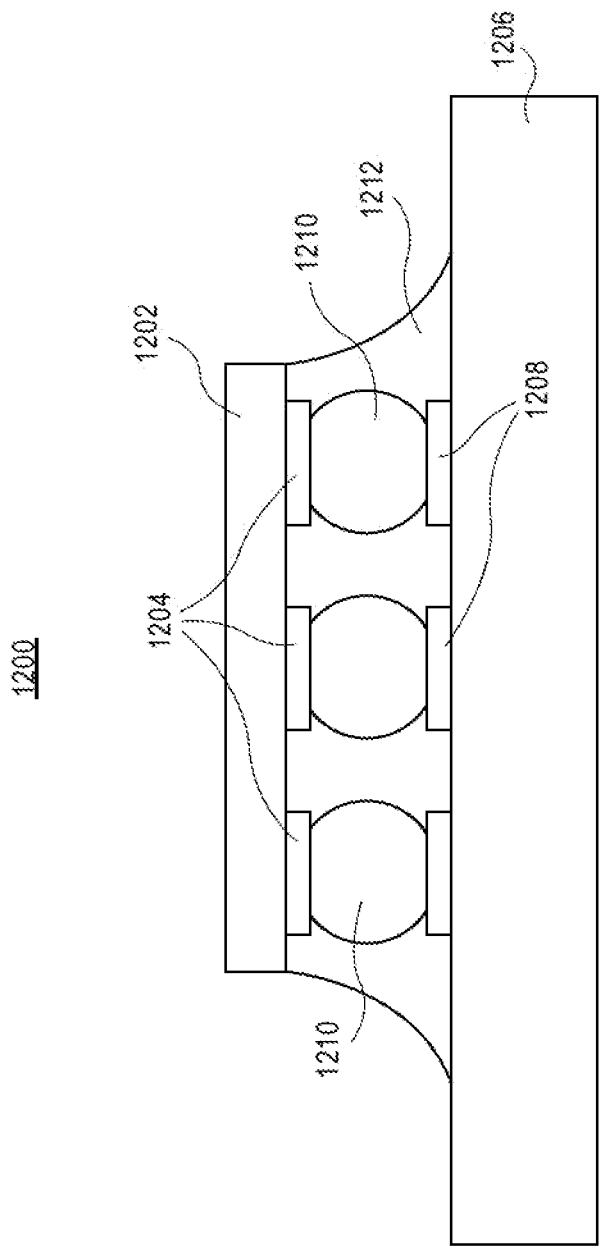
FIG. 12 illustrates a cross-sectional view of a flip-chip mounted die, in accordance with an embodiment of the present disclosure.

FIG. 12 illustrates a cross-sectional view of a flip-chip mounted die, in accordance with an embodiment of the present disclosure.

Referring to FIG. 12, an apparatus 1200 includes a die 1202 such as an integrated circuit (IC) fabricated according to one or more processes described herein or including one or more features described herein, in accordance with an embodiment of the present disclosure. The die 1202 includes metallized pads 1204 thereon. A package substrate 1206, such as a ceramic or organic substrate, includes connections 1208 thereon. The die 1202 and package substrate 1206 are electrically connected by solder balls 1210 coupled to the metallized pads 1204 and the connections 1208. An underfill material 1212 surrounds the solder balls 1210.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include contact over active gate structure with metal oxide layers to inhibit shorting and methods of fabricating contact over active gate structure with metal oxide layers.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a plurality of gate structures above substrate, each of the gate structures including a gate insulating layer thereon. A plurality of conductive trench contact structures is alternating with the plurality of gate structures. A portion of one of the plurality of trench contact structures has a metal oxide layer thereon. An interlayer dielectric material is over the plurality of gate structures and over the plurality of conductive trench contact structures. An opening is in the interlayer dielectric material and in a gate insulating layer of a corresponding one of the plurality of gate structures. A conductive via is in the opening, the conductive via in direct contact with the corresponding one of the plurality of gate structures, and the conductive via on the metal oxide layer.

Example embodiment 2: The integrated circuit structure of example embodiment 1, wherein the conductive via is on-set with the one of the plurality of gate structures.

Example embodiment 3: The integrated circuit structure of example embodiment 1, wherein the conductive via is off-set with the one of the plurality of gate structures.

Example embodiment 4: The integrated circuit structure of example embodiment 1, 2 or 3, further including a plurality of dielectric spacers alternating with the plurality of gate structures and the plurality of conductive trench contact structures.

Example embodiment 5: The integrated circuit structure of example embodiment 4, wherein the metal oxide layer is over a portion of one of the plurality of dielectric spacers beneath the conductive via.

Example embodiment 6: The integrated circuit structure of example embodiment 4, wherein the metal oxide layer is not over a portion of one of the plurality of dielectric spacers beneath the conductive via.

Example embodiment 7: The integrated circuit structure of example embodiment 1, 2, 3, 4, 5 or 6, wherein the metal oxide layer is selected from the group consisting of AlOx, HfOx, ZrOx, and TiOx.

Example embodiment 8: The integrated circuit structure of example embodiment 1, 2, 3, 4, 5, 6 or 7, wherein the plurality of conductive trench contact structures and the plurality of gate structures are on a semiconductor fin.

Example embodiment 9: An integrated circuit structure includes a plurality of gate structures above substrate. A plurality of conductive trench contact structures is alternating with the plurality of gate structures. An insulating layer is over the plurality of gate structures and over the plurality of conductive trench contact structures. An opening is in the insulating layer. A conductive via is in the opening, the conductive via in direct contact with one of the plurality of gate structures, and the conductive via having a top surface. A metal oxide layer is on and covering the top surface of the conductive via.

Example embodiment 10: The integrated circuit structure of example embodiment 9, wherein the metal oxide layer is selected from the group consisting of AlOx, HfOx, ZrOx, and TiOx.

Example embodiment 11: The integrated circuit structure of example embodiment 9 or 10, wherein the plurality of conductive trench contact structures and the plurality of gate structures are on a semiconductor fin.

Example embodiment 12: A computing device includes a board and a component coupled to the board. The component includes an integrated circuit structure. The integrated circuit structure includes a plurality of gate structures above substrate, each of the gate structures including a gate insulating layer thereon. A plurality of conductive trench contact structures is alternating with the plurality of gate structures. A portion of one of the plurality of trench contact structures has a metal oxide layer thereon. An interlayer dielectric material is over the plurality of gate structures and over the plurality of conductive trench contact structures. An opening is in the interlayer dielectric material and in a gate insulating layer of a corresponding one of the plurality of gate structures. A conductive via is in the opening, the conductive via in direct contact with the corresponding one of the plurality of gate structures, and the conductive via on the metal oxide layer.

Example embodiment 13: The computing device of example embodiment 12, further including a memory coupled to the board.

Example embodiment 14: The computing device of example embodiment 12 or 13, further including a communication chip coupled to the board.

Example embodiment 15: The computing device of example embodiment 12, 13 or 14, further including a camera coupled to the board.

Example embodiment 16: The computing device of example embodiment 12, 13, 14 or 15, further including a battery coupled to the board.

Example embodiment 17: The computing device of example embodiment 12, 13, 14, 15 or 16, further including an antenna coupled to the board.

Example embodiment 18: The computing device of example embodiment 12, 13, 14, 15, 16 or 17, wherein the component is a packaged integrated circuit die.

Example embodiment 19: The computing device of example embodiment 12, 13, 14, 15, 16, 17 or 18, wherein the component is selected from the group consisting of a processor, a communications chip, and a digital signal processor.

Example embodiment 20: The computing device of example embodiment 12, 13, 14, 15, 16, 17, 18 or 19, wherein the computing device is selected from the group consisting of a mobile phone, a laptop, a desk top computer, a server, and a set-top box.

What is claimed is:

1. An integrated circuit structure, comprising:
    a plurality of gate structures, each of the gate structures including a gate insulating layer thereon;
    a plurality of conductive trench contact structures alternating with the plurality of gate structures, a portion of one of the plurality of trench contact structures having a metal oxide layer thereon;
    an interlayer dielectric material over the plurality of gate structures and over the plurality of conductive trench contact structures;
    an opening in the interlayer dielectric material and in the gate insulating layer of a corresponding one of the plurality of gate structures, wherein the metal oxide layer is confined to the opening; and
    a conductive via in the opening, the conductive via in direct contact with the corresponding one of the plurality of gate structures, and the conductive via on the metal oxide layer.

2. The integrated circuit structure of claim 1, wherein the conductive via is on-set with the one of the plurality of gate structures.

3. The integrated circuit structure of claim 1, wherein the conductive via is off-set with the one of the plurality of gate structures.

4. The integrated circuit structure of claim 1, further comprising:
    a plurality of dielectric spacers alternating with the plurality of gate structures and the plurality of conductive trench contact structures.

5. The integrated circuit structure of claim 4, wherein the metal oxide layer is over a portion of one of the plurality of dielectric spacers beneath the conductive via.

6. The integrated circuit structure of claim 4, wherein the metal oxide layer is not over a portion of one of the plurality of dielectric spacers beneath the conductive via.

7. The integrated circuit structure of claim 1, wherein the metal oxide layer is selected from the group consisting of AlOx, HfOx, ZrOx, and TiOx.

8. The integrated circuit structure of claim 1, wherein the plurality of conductive trench contact structures and the plurality of gate structures are on a semiconductor fin.

9. A computing device, comprising:
    a board; and
    a component coupled to the board, the component including an integrated circuit structure, comprising:
        a plurality of gate structures, each of the gate structures including a gate insulating layer thereon;
        a plurality of conductive trench contact structures alternating with the plurality of gate structures, a portion of one of the plurality of trench contact structures having a metal oxide layer thereon;
        an interlayer dielectric material over the plurality of gate structures and over the plurality of conductive trench contact structures;
        an opening in the interlayer dielectric material and in the gate insulating layer of a corresponding one of the plurality of gate structures, wherein the metal oxide layer is confined to the opening; and
        a conductive via in the opening, the conductive via in direct contact with the corresponding one of the plurality of gate structures, and the conductive via on the metal oxide layer.

10. The computing device of claim 9, further comprising: a memory coupled to the board.

11. The computing device of claim 9, further comprising: a communication chip coupled to the board.

12. The computing device of claim 9, further comprising: a camera coupled to the board.

13. The computing device of claim 9, further comprising: a battery coupled to the board.

14. The computing device of claim 9, further comprising: an antenna coupled to the board.

15. The computing device of claim 9, wherein the component is a packaged integrated circuit die.

16. The computing device of claim 9, wherein the component is selected from the group consisting of a processor, a communications chip, and a digital signal processor.

17. The computing device of claim 9, wherein the computing device is selected from the group consisting of a mobile phone, a laptop, a desk top computer, a server, and a set-top box.

* * * * *